United States Patent
Lee et al.

(10) Patent No.: US 11,501,843 B2
(45) Date of Patent: Nov. 15, 2022

(54) STORAGE DEVICE THAT USES A HOST MEMORY BUFFER AND A MEMORY MANAGEMENT METHOD INCLUDING THE SAME

(71) Applicant: SAMSUNG ELECTRONICS CO., LTD., Suwon-si (KR)

(72) Inventors: Dong-Ryoul Lee, Incheon (KR); Hyun Ju Yi, Hwaseong-si (KR); Jaeho Sim, Seoul (KR); Kicheol Eom, Seoul (KR); Hyotaek Leem, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 9 days.

(21) Appl. No.: 17/307,314

(22) Filed: May 4, 2021

(65) Prior Publication Data

US 2021/0257034 A1    Aug. 19, 2021

Related U.S. Application Data

(63) Continuation of application No. 16/539,729, filed on Aug. 13, 2019, now Pat. No. 11,011,243.

(30) Foreign Application Priority Data

Nov. 14, 2018  (KR) .................. 10-2018-0140166

(51) Int. Cl.
  *G11C 16/34*      (2006.01)
  *G06F 11/30*      (2006.01)
  *G06F 11/00*      (2006.01)
  *G06F 11/07*      (2006.01)
  *G11C 11/56*      (2006.01)
  *G06F 13/16*      (2006.01)
  *G06F 3/06*       (2006.01)

(52) U.S. Cl.
  CPC .......... *G11C 16/349* (2013.01); *G06F 3/064* (2013.01); *G06F 3/0619* (2013.01); *G06F 3/0673* (2013.01); *G06F 11/008* (2013.01); *G06F 11/076* (2013.01); *G06F 11/3034* (2013.01); *G06F 13/1673* (2013.01); *G11C 11/5628* (2013.01); *G11C 11/5642* (2013.01); *G11C 16/3495* (2013.01)

(58) Field of Classification Search
  CPC . G06F 11/3034; G06F 11/008; G11C 16/3495
  See application file for complete search history.

(56) References Cited

U.S. PATENT DOCUMENTS

| | | | |
|---|---|---|---|
| 7,664,889 B2 * | 2/2010 | Vemula | G06F 13/28 710/52 |
| 9,575,884 B2 | 2/2017 | Chun et al. | |
| 2005/0162897 A1 | 7/2005 | Alva | |

(Continued)

*Primary Examiner* — Joseph D Torres
(74) *Attorney, Agent, or Firm* — F. Chau & Associates, LLC (57) ABSTRACT

A storage device is provided which shares a host memory with a host. The storage device includes an interface that exchanges data with the host and implements a protocol to use a partial area of the host memory as a buffer of the storage device. A storage controller of the storage device monitors deterioration information of a first area of the buffer and transmits a corruption prediction notification associated with the first area to the host based on a result of the monitoring.

18 Claims, 9 Drawing Sheets

(56) References Cited

U.S. PATENT DOCUMENTS

| | | | |
|---|---|---|---|
| 2006/0015660 A1* | 1/2006 | Nguyen | G06F 3/0656 710/52 |
| 2007/0283217 A1 | 12/2007 | Gorfajn et al. | |
| 2015/0200688 A1* | 7/2015 | Pan | H03M 13/3927 714/794 |
| 2016/0026406 A1* | 1/2016 | Hahn | G06F 12/0246 711/103 |
| 2016/0246726 A1 | 8/2016 | Hahn | |
| 2017/0206030 A1 | 7/2017 | Woo et al. | |
| 2017/0242606 A1* | 8/2017 | Vlaiko | G06F 13/4282 |
| 2017/0285940 A1* | 10/2017 | Benisty | G06F 3/067 |
| 2017/0300246 A1 | 10/2017 | Michaeli | |
| 2017/0351452 A1* | 12/2017 | Boyd | G06F 3/0611 |
| 2018/0018101 A1* | 1/2018 | Benisty | G06F 3/0659 |
| 2018/0039541 A1* | 2/2018 | Hahn | G06F 11/108 |
| 2018/0039578 A1 | 2/2018 | Yun et al. | |
| 2018/0067684 A1* | 3/2018 | Benisty | G11C 29/52 |
| 2018/0069658 A1* | 3/2018 | Benisty | G06F 11/1004 |
| 2018/0074722 A1 | 3/2018 | Iwai | |
| 2018/0136875 A1 | 5/2018 | Nimmagadda et al. | |
| 2020/0151040 A1 | 5/2020 | Lee et al. | |

\* cited by examiner

HMB Health State Table (1246)

| HMB area | Data type | Write Count (WC) | Read Count (RC) | Error rate (ER) |
|---|---|---|---|---|
| HMB1 | Mapping data | 6000 | 2000 | 0.05 |
| HMB2 | User data | 210 | 220 | 0.01 |
| HMB3 | Management data | 1500 | 7000 | 0.03 |

STORAGE DEVICE THAT USES A HOST MEMORY BUFFER AND A MEMORY MANAGEMENT METHOD INCLUDING THE SAME

CROSS-REFERENCE TO RELATED APPLICATIONS

This application is a continuation of U.S. patent application Ser. No. 16/539,729 filed on Aug. 13, 2019, which claims priority under 35 U.S.C. § 119 to Korean Patent Application No. 10-2018-0140166 filed on Nov. 14, 2018, in the Korean Intellectual Property Office, the disclosures of which are incorporated by reference herein in their entireties.

TECHNICAL FIELD

Exemplary embodiments of the present inventive concept relate to a storage device, and more particularly, to a storage device that uses a host memory buffer and a memory management method including the same.

DESCRIPTION OF RELATED ART

An example of a flash memory-based mass storage device is a solid state drive (hereinafter referred to as "SSD"). The SSD is used for various purposes and the demands on the SSD are increasing. For example, the SSD may be used for a server, a client, a data center, etc. An interface of the SSD should provide the best speed and reliability for each purpose. To satisfy such a demand, interfaces such as a serial advanced technology attachment (SATA) interface, a peripheral component interconnect express (PCIe) interface, and a serial attached small computer system interface (SAS) are being used. In particular, PCIe-based non-volatile memory express (NVMe) or universal flash storage (UFS)-based unified memory extension (UME) are being developed and applied to storage devices. The interface provides a memory sharing function between devices. Accordingly, a data managing method is required with regard to a storage device which uses a memory resource sharing scheme.

In a storage device using a memory sharing scheme, an issue may occur with respect to managing the reliability of the memory which the storage device and the host share. The reason for this is that a memory area which the host allocates to the storage device is contained within the host but is managed by the storage device. In addition, data for managing the storage device are loaded onto and updated in a memory area (hereinafter referred to as a "host memory buffer") of a host, which is shared with the host. Accordingly, there is a need to manage the reliability of data stored in a host memory buffer (HMB).

SUMMARY

According to an exemplary embodiment of the present inventive concept, a storage device is provided which shares a host memory with a host. The storage device includes an interface that exchanges data with the host and implements a protocol to use a partial area of the host memory as a buffer of the storage device. A storage controller of the storage device monitors deterioration information of a first area of the buffer and transmits a corruption prediction notification associated with the first area to the host based on a result of the monitoring.

According to an exemplary embodiment of the present inventive concept, a memory management method of a storage device to which a host memory of a host is allocated is provided. The memory management method includes dividing, at the storage device, the buffer into a plurality of buffer areas and detecting deterioration information of each of the plurality of buffer areas. The memory management method also includes using the storage device to determine, whether a first buffer area exceeds an error threshold based upon the detected deterioration information. A corruption prediction notification is transmitted to the host that is associated with the first buffer area when the first buffer area exceeds the error threshold.

According to an exemplary embodiment of the present inventive concept, a storage device is provided which uses a host memory of a host as a buffer. The storage device includes an interface configured to communicate with the host, a non-volatile memory device, and a storage controller configured to divide a buffer area allocated from the host memory through the interface into a plurality of buffer areas. The storage device monitors a deterioration state for each of the plurality of buffer areas, and transmits a corruption notification or a corruption prediction notification when a deterioration state exceeds a threshold.

BRIEF DESCRIPTION OF THE FIGURES

The above and other aspects and features of the present inventive concept will be more clearly understood from the following detailed description, taken in conjunction with reference to the accompanying drawings, in which.

DETAILED DESCRIPTION OF THE EMBODIMENTS

Exemplary embodiments of the present inventive concept will now be described more fully with reference to the accompanying drawings. However, the inventive concept may be embodied in many alternate forms and should not be construed as limited to only the exemplary embodiments of the present disclosure set forth herein. It shall be understood that like reference numerals may refer to like elements throughout the detailed description and accompanying figures. Below, a solid state drive (SSD) using a flash memory device will be used as an example of a storage device for describing the features and functions of the inventive concept. However, it is to be understood that this is merely exemplary and that other memory devices are applicable to the inventive concept described herein.

Figure 1:
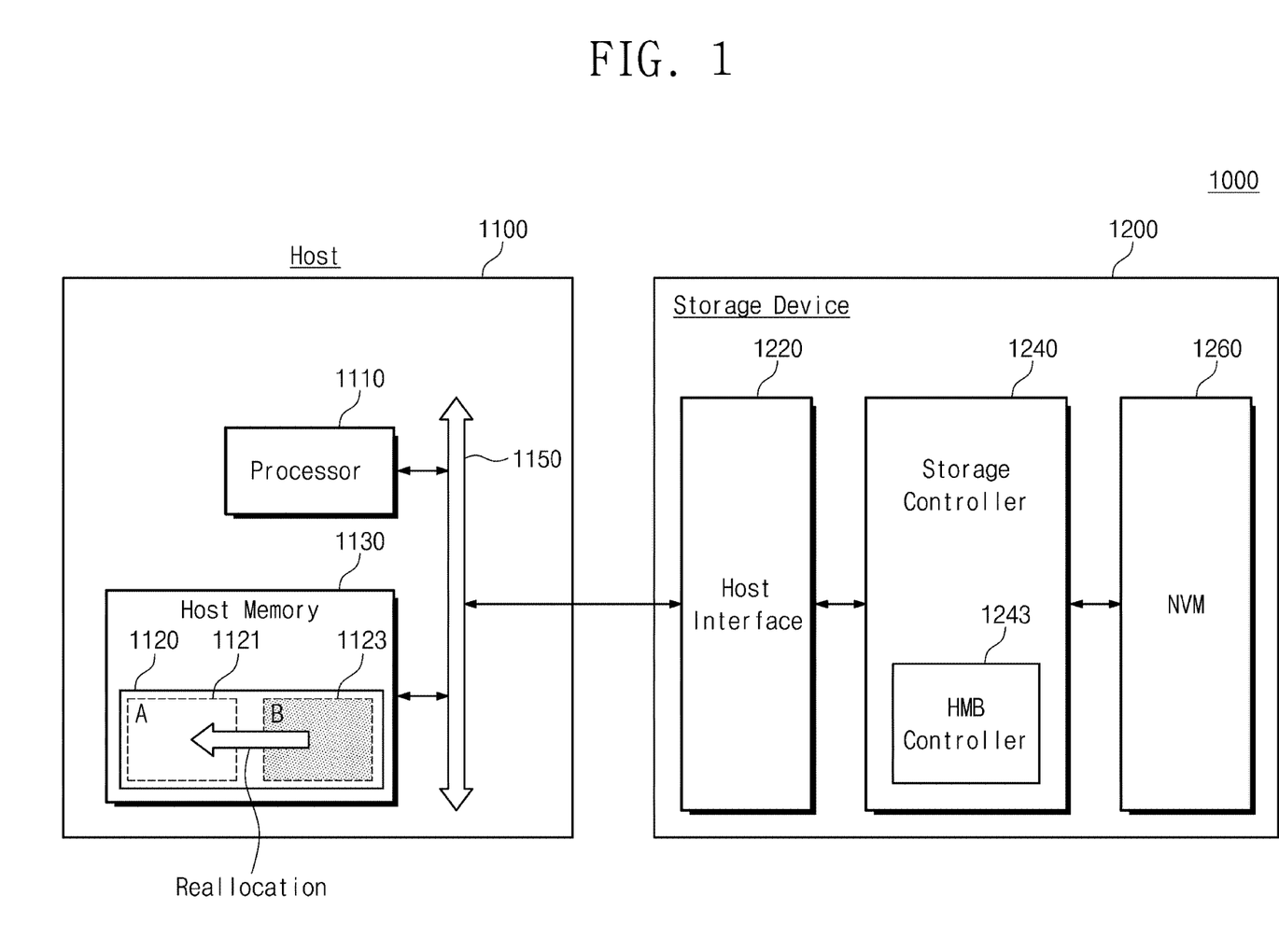
FIG. 1 is a block diagram illustrating a computer system to which a storage device according to an exemplary embodiment of the present inventive concept is connected.

FIG. 1 is a block diagram illustrating a computer system to which a storage device according to an exemplary embodiment of the present inventive concept is connected. Referring to FIG. 1, a computer system 1000 includes a host 1100 and a storage device 1200. The host 1100 may access the storage device 1200 for the purpose of storing or reading data in or from a non-volatile memory device (NVM) 1260. The storage device 1200 stores or reads data in or from the NVM 1260 in response to an access request of the host 1100. A partial area of the host memory 1130 of the host 1100 may be allocated to the storage device 1200 as a HMB 1120. The storage device 1200 may manage the HMB 1120 as a master.

The host 1100 may write data in the storage device 1200 or read data stored in the storage device 1200. The host 1100 may provide a command and an address for the purpose of writing data in the storage device 1200. The host 1100 may provide a command and an address to the storage device 1200 for the purpose of reading data stored in the storage device 1200.

The host 1100 may include a processor 1110, the host memory 1130, and an interface circuit 1150. An application program, a file system, a device driver, etc. may be loaded onto the host memory 1130. Various software which is driven in the host 1100 and data may be loaded onto the host memory 1130. In particular, the host 1100 may allocate a partial area of the host memory 1130 for the HMB 1120 acting as a buffer of the storage device 1200.

The HMB 1120 is allocated to allow the storage device 1200 to use the host memory 1130 as a buffer. An area of the HMB 1120 is monitored by the storage device 1200. The storage device 1200 may divide the HMB 1120 into areas and may monitor a deterioration state for each area. In addition, the storage device 1200 may monitor an error rate of data stored in the divided areas of the HMB 1120 and may determine whether corruption occurs.

Upon receiving the monitoring result from the storage device 1200, the host 1100 may reallocate all or a part of the HMB 1120. For example, in the event that a second HMB 1123 deteriorates a predetermined level or greater the host 1100 is notified by the storage device 1200. In response to the notification of the storage device 1200, the host 1100 may reallocate the second HMB 1123 to a first HMB 1121.

The interface circuit 1150 provides a connection between the processor 1110, the host memory 1130, and the host interface 1220, In other words, the interface circuit 1150 may convert a command, an address, data, etc. which correspond to various access requests generated from the host 1100, so as to be suitable for an interface with the storage device 1200. A protocol of the interface circuit 1150 may include at least one of a universal serial bus (USB), a small computer system interface (SCSI), a PCIe, an advanced technology attachment (ATA), a parallel ATA (PATA), a serial ATA (SATA), a SAS, and a UFS.

The storage device 1200 may be provided as data storage of the host 1100. The storage device 1200 may include a host interface 1220, a storage controller 1240, and the non-volatile memory device 1260. The storage device 1200 may access the non-volatile memory device 1260 in response to a command CMD from the host 1100 or may perform various operations requested by the host 1100.

The host interface 1220 is provided as a physical communication channel of the storage device 1200 for data exchange with the host 1100. The host interface 1220 may have an interfacing protocol which allows the HMB 1120 to support a buffer function of the storage device 1200. The host interface 1220 may support interfacing protocol for mutual sharing of a memory resource of the host 1100 and a memory resource of the storage device 1200. For example, the storage controller 1240 may make it possible for the host interface 1220 to manage the HMB 1120 and an internal buffer of the storage device 1200 by using one memory map.

The storage controller 1240 provides interfacing between the host 1100 and the storage device 1200. The storage controller 1240 may write user data in the non-volatile memory device 1260 depending on a request from the host 1100. The storage controller 1240 may include a HMB controller 1243 which exclusively manages the HMB 1120. The HMB controller 1243 may monitor a deterioration state or an error rate of data for each area of the HMB 1120. The HMB controller 1243 may monitor whether an error rate of a threshold amount or a deterioration of a threshold level or higher exists. When a data error of the HMB 1120 occurs, the HMB controller 1243 provides notification to the host 1100 that an error has occurred. Alternatively, before deterioration becomes more severe and thus serious corruption ensues, the HMB controller 1243 may preemptively notify the host 1100 by providing information about the potential event.

The non-volatile memory device (NVM) 1260 is provided as a storage medium of the storage device 1200. The NVM 1260 may include a non-volatile memory such as a flash memory, a phase-change random access memory (PRAM), a magnetic random access memory (MRAM), a resistive random access memory (ReRAM), a ferroelectric random access memory (FRAM), a magnetic disk, etc.

According to an exemplary embodiment of the present inventive concept, the storage device 1200 may monitor the HMB 1120 and may provide a corruption prediction notification or a corruption notification to the host 1100 depending on a monitoring result. In the case where the monitoring result indicates that an uncorrectable error occurs in a specific area of the HMB 1120, the storage device 1200 may provide a corruption notification to the host 1100. In this case, the host 1100 may reallocate the memory area of the HMB 1120. In addition, the storage device 1200 may monitor a deterioration state of the HMB 1120 for each area and may notify the host 1100 of a monitoring result. Even though an error does not occur in a specific area of the HMB 1120, the host memory 1120 may be monitored for deterioration that exceeds a threshold value. When deterioration is detected, the storage device 1200 may provide a corruption prediction notification to the host 1100 such that the host 1100 reallocates the specific area of the HMB 1120 to another area.

According to the computer system 1000 of the present inventive concept, the storage device 1200 may monitor the HMB 1120 for each area. The storage device 1200 may provide a monitoring result (indicating corruption or corruption prediction) to the host 1100 to request the host 1100 to reallocate the HMB 1120.

Figure 2:
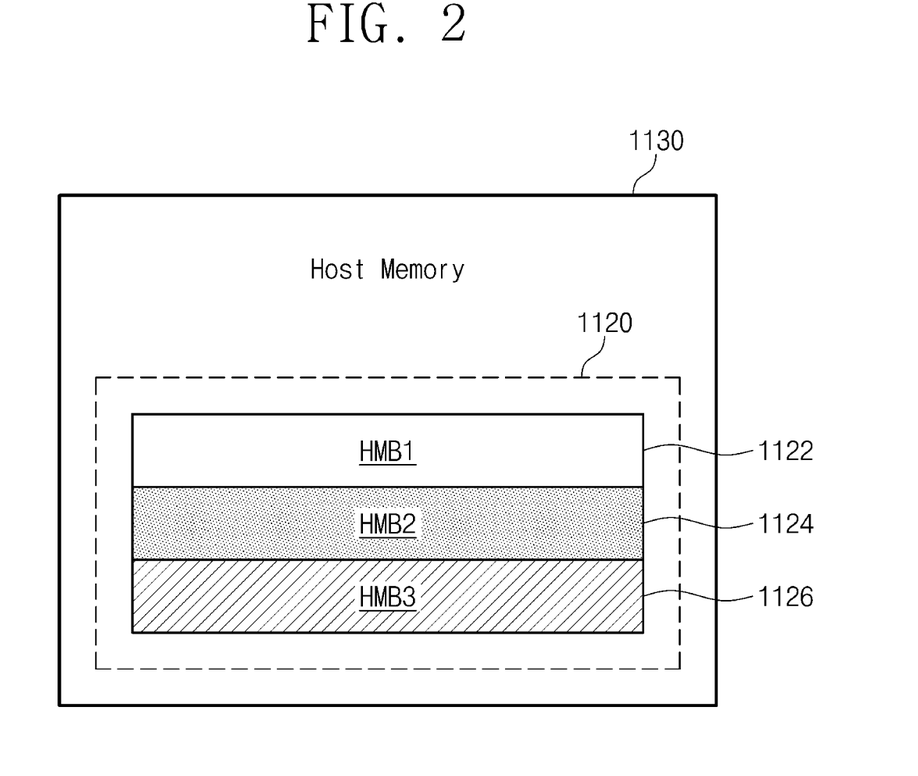
FIG. 2 is a block diagram illustrating the host memory illustrated in FIG. 1.

FIG. 2 is a block diagram illustrating a host memory illustrated in FIG. 1. Referring to FIG. 2, a partial area of the host memory 1130 may be allocated to the HMB 1120. In addition, the HMB 1120 may be reallocated to another memory area of the host memory 1130 depending on a notification or a request from the storage device 1200.

The host memory 1130 is a memory provided in the host 1100. For example, the host memory 1130 may be implemented with a volatile memory such as a dynamic random access memory (DRAM) or a static random access memory (SRAM) or may be implemented with a non-volatile memory. However, it may be understood that the host memory 1130 may be variously implemented depending on a purpose. The host memory 1130 may store or output data requested by the host 1100. In addition, the HMB 1120 which is allocated to a buffer of the storage device 1200 is included in the host memory 1130. The HMB 1120 may be allocated to a specific memory area of the host memory 1130 or may be allocated on the host memory 1130 with an optimum size according to information of the storage device 1200.

The HMB 1120 is a memory area which corresponds to a partial area of the host memory 1130 allocated to be used as a buffer of the storage device 1200. Accordingly, the storage device 1200 may use the HMB 1120 as a buffer without a separate internal buffer. An internal buffer provided in the storage device 1200 may be difficult to provide a sufficient capacity due to various issues such as costs, a device size, and limit on design. However, in the case where the HMB 1120 is shared to allow the storage device 1200 to use a partial area of the host memory 1130, the storage device 1200 may secure a sufficient buffer capacity.

The HMB 1120 may be divided into a plurality of HMB areas 1122, 1124, and 1126 depending on attributes of data (hereinafter referred to as "buffer data") to be stored. For example, mapping data of the storage device 1200 may be stored in the HMB1 area 1122. User data may be stored in the HMB2 area 1124. Management data for managing the storage device 1200 may be stored in the HMB3 area 1126. However, a reference for dividing the HMB 1120 into the HMB areas 1122, 1124, and 1126 is not limited to the attributes of data to be stored. The HMB 1120 may be divided into a plurality of areas to make memory management easy.

In the case of dividing the HMB 1120 into a plurality of areas depending on attributes of data to be stored, a health state may be efficiently monitored by the HMB controller 1243. In other words, in the case of detecting a defect, data corruption, or a deterioration progress state of an HMB area, it may be easy to reallocate any one HMB area to a new HMB area.

The HMB 1120 may be divided into a plurality of HMB areas depending on attributes of buffer data to be stored. In the case of the HMB 1120, a health state may be monitored for each of the HMB areas 1122, 1124, and 1126. HMB areas may be reallocated to another new area of the host memory 1130 as necessary in response to a detected defect, data corruption, or a deterioration state. For example, the HMB areas 1122, 1124, and 1126 may be independently reallocated to an available HMB area or elsewhere in the host memory 1130.

Figure 3:
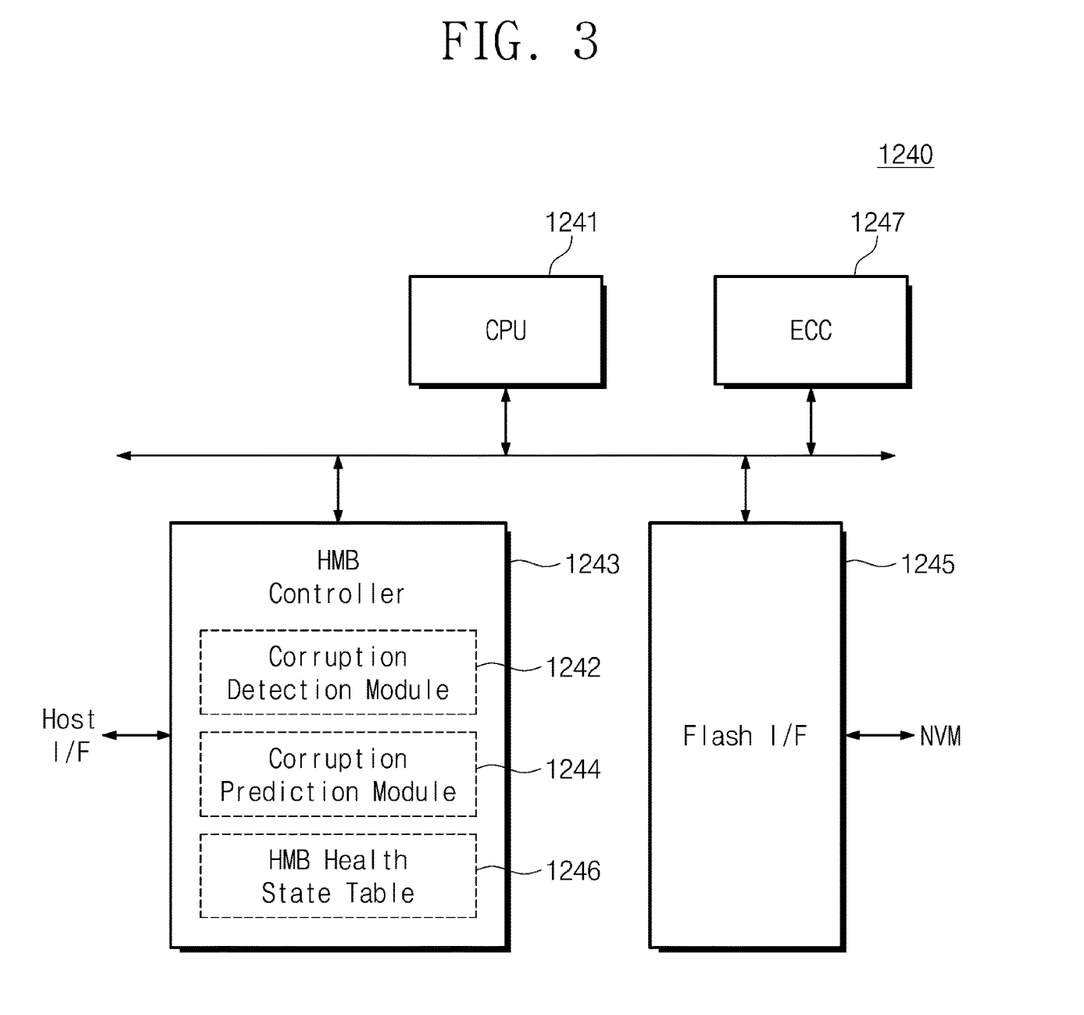
FIG. 3 is a block diagram illustrating an exemplary configuration of the storage controller illustrated in FIG. 1.

FIG. 3 is a block diagram illustrating a configuration of a storage controller illustrated in the exemplary embodiment of the present inventive concept according to FIG. 1. Referring to FIG. 3, the storage controller 1240 may include a central processing unit (CPU) 1241, the HMB controller 1243, a flash interface 1245, and an error correction block (ECC) 1247. In particular, the HMB controller 1243 may drive or include corruption detection module 1242 and corruption prediction module 1244 for managing the HMB 1120, and an HMB health state table 1246.

The CPU 1241 may perform various memory management operations of the storage device 1200. For example, the CPU 1241 may control the HMB controller 1243 and the flash interface (I/F) 1245 in response to a command from the host 1100 for the purpose of writing data in the non-volatile memory device 1260. The CPU 1241 prompts the HMB controller 1243 to read data from the HMB 1120.

Depending on a request of the CPU 1241, the HMB controller 1243 may write data in the HMB 1120 or may read the written data from the HMB 1120. The HMB controller 1243 may monitor data corruption or a health state according to a defect or a deterioration of the HMB 1120. The HMB controller 1243 may include the corruption detection module 1242, the corruption prediction module 1244, and the HMB health state table 1246 for the purpose of monitoring data corruption or a health state of the HMB 1120.

The corruption detection module 1242 determines a defect of the HMB 1120 with reference to whether an error is present in data read from the HMB 1120, an error rate, and/or whether an error is correctable. For example, in the case where an uncorrectable error is detected from data read from a specific HMB area of the HMB 1120, the corruption detection module 1242 may determine the case as a defect or a deterioration of the specific HMB area. Based on the determination, the HMB controller 1243 may provide a corruption notification to the host 1100 or may request the host 1100 to reallocate an HMB area.

The corruption prediction module 1244 continuously monitors an error rate of data read from the HMB 1120 or a read count or a write count, and may update a monitoring result in the HMB health state table 1246. For example, when a write count of an HMB area of the HMB 1120 is greater than a threshold value, the corruption prediction module 1244 may predict that a defect may occur in the specific HMB area at a later time. Based on the determination, the HMB controller 1243 may request the host 1100 to reallocate an HMB area.

Information about the health state of each of the HMB areas monitored by the corruption detection module 1242 or the corruption prediction module 1244 may be stored or updated in the HMB health state table 1246. A requestor notification for HMB reallocation may be provided to the host 1100 depending on a read count, a write count, and/or an error rate of each of HMB areas updated in the HMB health state table 1246.

The ECC 1247 detects an error of data read from the HMB 1120. In the case where a correctable error is present in the data read from the HMB 1120, the ECC 1247 may correct the detected error. The ECC 1247 may provide the HMB controller 1243 with the number of error bits of data read from the HMB 1120, an error rate, and/or whether a detected error is correctable.

As described above, the storage controller 1240 of the inventive concept may detect corruption of the HMB 1120 or may predict corruption according to a progression of data deterioration. In addition, the storage controller 1240 may provide the host 1100 with a corruption notification or a corruption prediction notification, based on the detected corruption or corruption prediction information. The host 1100 may reallocate a corrupted HMB area to a normal memory area of the host memory 1130 in response to the corruption notification or the corruption prediction notification.

Figure 4:
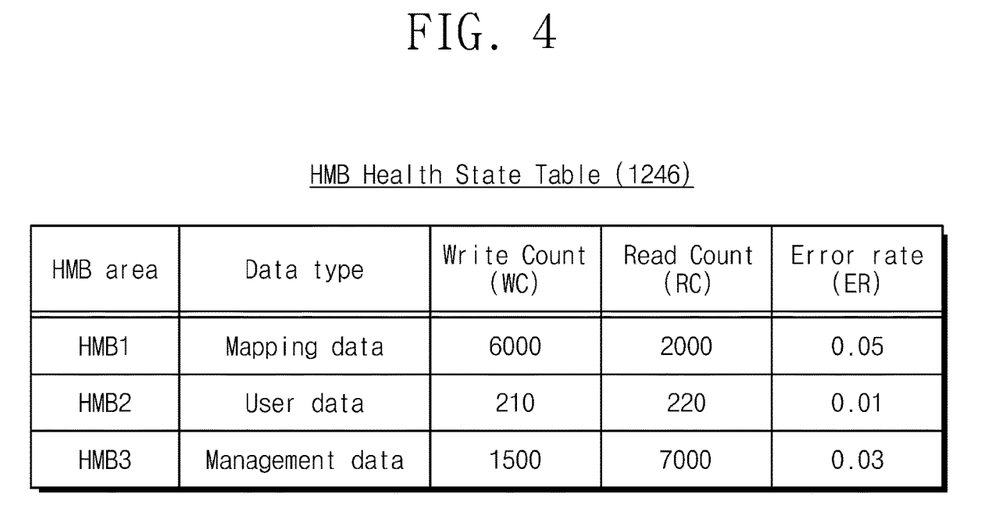
FIG. 4 illustrates a health state table for each area HMB according to an exemplary embodiment of the present inventive concept.

FIG. 4 illustrates a HMB health state table 1246 for each area of a HMB according to an exemplary embodiment of the present inventive concept. Referring to FIG. 4, the HMB 1120 may be divided into a plurality of areas depending on attributes of buffer data to be stored. Deterioration information or corruption information about each of the plurality of areas may be stored and/or updated in the HMB health state table 1246.

A health state for each area of the HMB 1120 may be managed or updated for each of the divided areas. Reference information indicating an exemplary health state for each area may include a write count and a read count of each area and an error rate detected from data stored in each area. However, it may be understood that any other management parameters and/or criteria associated with each area of the HMB 1120 may be used as health state information stored in the HMB health state table 1246.

According to an exemplary embodiment of the present inventive concept, mapping data associated with address mapping of the non-volatile memory device 1260 may be stored in the first HMB area HMB1. User data to be programmed in the storage device 1200 may be temporarily stored in the second HMB area HMB2. Management data for managing or controlling the storage device 1200 may be stored in the third HMB area HMB3.

The corruption detection module 1242 or the corruption prediction module 1244 of the HMB controller 1243 may monitor or update a write count WC, a read count RC, and an error rate ER of each of the areas HMB1, HMB2, and HMB3 of the HMB health state table 1246. In the case where the error rate ER detected from a specific HMB area corresponds to an uncorrectable value, the corruption detection module 1242 may transmit a corruption notification associated with the specific HMB area to the host 1100. In the case where at least one of the write count WC, the read count RC, and the error rate ER reaches or exceeds a threshold value, the corruption prediction module 1244 may transmit a corruption prediction notification associated with a relevant HMB area to the host 1100. For example, the threshold write count WC, read count RC, and error rate ER may be different values from one another. The corruption notification or the corruption prediction notification may include reallocation request information associated with the relevant HMB area.

Figure 5:
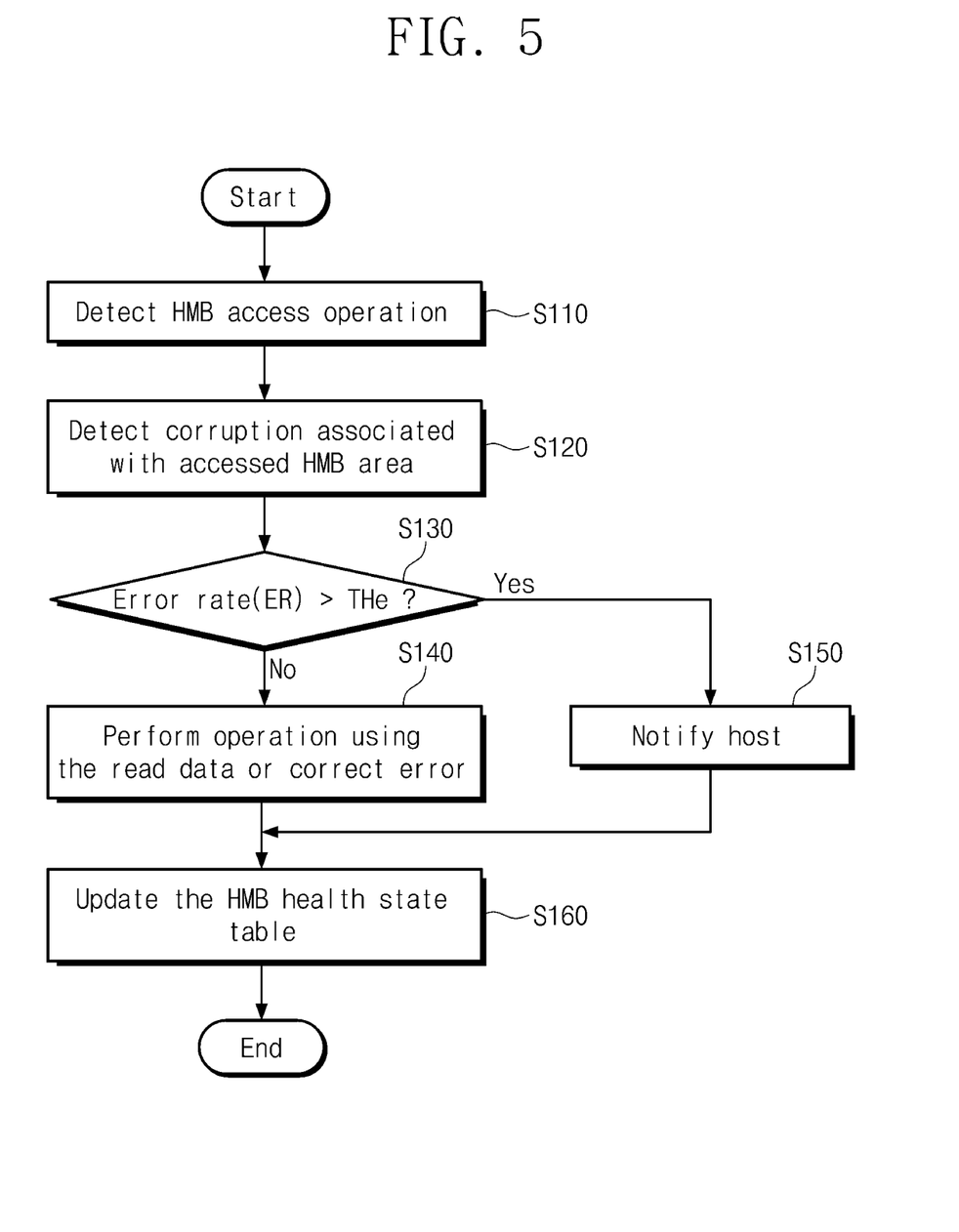
FIG. 5 is a flowchart illustrating an operation of an HMB controller or a corruption detection module illustrated in FIG. 3.

FIG. 5 is a flowchart illustrating a corruption detecting operation of an HMB controller 1243. Referring to FIG. 5, the HMB controller 1243 may detect and/or monitor the error rate ER of data read from the HMB 1120 for each area.

In operation S110, the HMB controller 1243 detects or receives a request for an access to the HMB 1120 from the CPU 1241. Here, for brevity of description, it is assumed that a read request for the HMB 1120 is received.

In operation S120, the HMB controller 1243 detects whether corruption of data read from the HMB 1120 exists. For example, an error of the data read from the HMB 1120 may be detected by the ECC 1247.

In operation S130, the HMB controller 1243 determines whether the error rate ER of the data read from the HMB 1120 exceeds an error rate threshold value THe. When it is determined that the error rate ER of the read data is greater than the error rate threshold value THe, the flow proceeds to notify the host in operation S150. When it is determined that the error rate ER of the read data is less than or equal to the error rate threshold value THe, the flow proceeds to perform operation using the read data or correct error in operation S140.

In operation S140, the HMB controller 1243 may perform a memory management operation using read data from which an error is not detected. Alternatively, the storage controller 1240 may correct an error of read data including a correctable error. The storage controller 1240 may perform a memory management operation or a data transmission operation by using the error-corrected read data.

In operation S150, when the HMB controller 1243 determines that a specific area of the HMB 1120 is corrupted, the host 1100 is notified of information about the event. Alternatively, the storage controller 1240 may allocate an HMB area where an uncorrectable error is detected to a new area of the host memory 1130.

In operation S160, the storage controller 1240 updates the error rate ER of an HMB area stored in the HMB health state table 1246. Afterwards, in the case where the new HMB area is allocated, the storage controller 1240 may create an item associated with the newly allocated area in the HMB health state table 1246.

Figure 6:
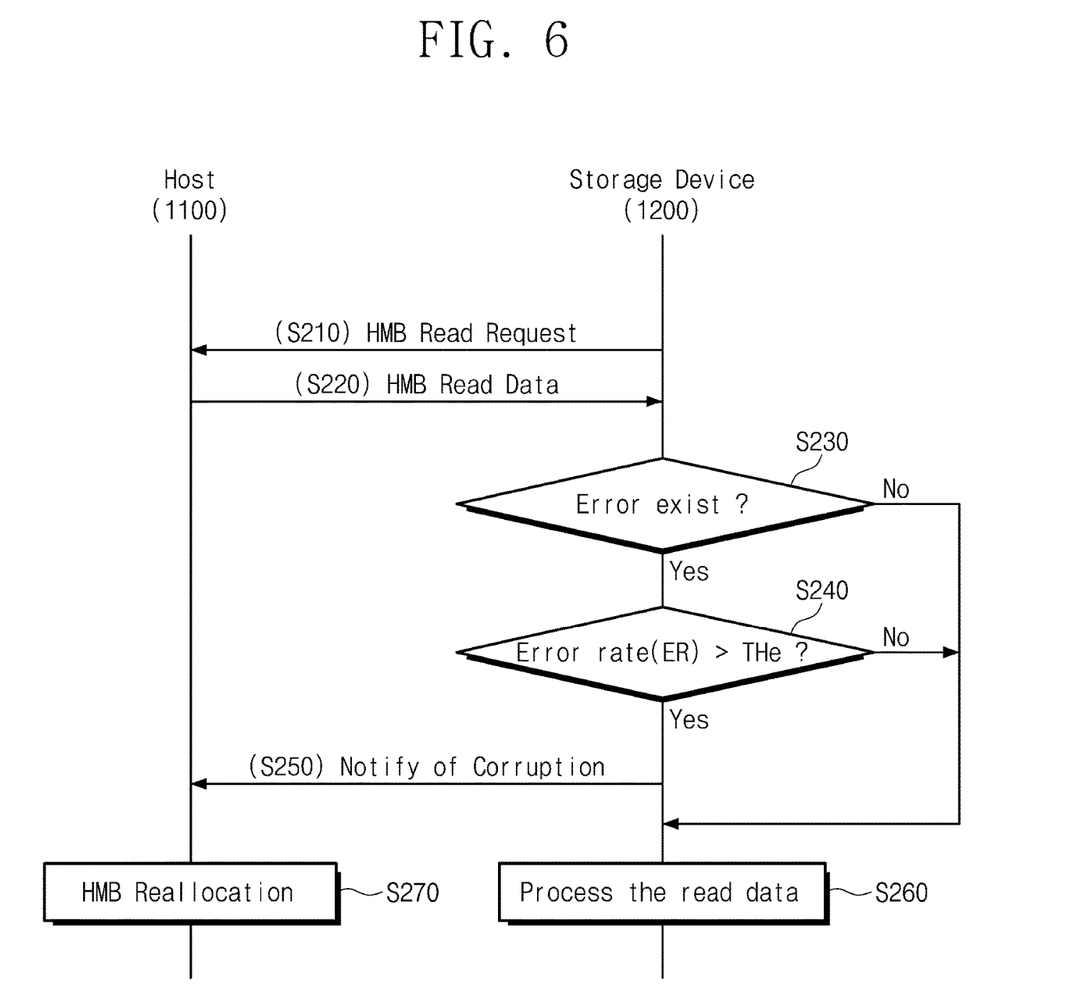
FIG. 6 is a diagram illustrating a mutual operation of a storage controller transmitting a corruption notification and a host.

FIG. 6 is a diagram illustrating an operation of a storage controller 1240 transmitting a corruption notification to a host 1100. Referring to FIG. 6, the host 1100 may reallocate an HMB area in response to the corruption notification transmitted by the storage controller 1240 of the storage device 1200.

In operation S210, the storage device 1200 transmits a read request for reading data stored in the HMB 1120 to the host 1100.

In operation S220, the host 1100 may read data of a specified HMB area of the HMB 1120 and may transmit the read data to the storage device 1200.

In operation S230, the storage controller 1240 may detect whether an error is present in the data read from the HMB 1120, by using the ECC 1247. When an error is not detected from the read data (No), in operation S260, the storage controller 1240 may process the read data. For example, the storage controller 1240 may perform a memory management operation of the storage device 1200 by using the read data, or may transmit the read data to the host 1100 or the non-volatile memory device 1260.

When an error is present in the read data (Yes), the storage controller 1240 may transmit a corruption notification to the host 1100 with reference to a size of the error rate, or may process the read data through error correction. According to an exemplary embodiment of the present inventive concept, when the size of the error rate ER meets or exceeds the error rate threshold value THe, in operation S250, the storage controller 1240 determines that the error is uncorrectable and transmits a corruption notification to the host 1100.

In operation S270, the host 1100 may reallocate the HMB area of the HMB 1120 in response to the corruption notification to a normal memory area. Alternatively, the host 1100 may attempt to adjust or initialize an operating parameter and a training parameter which are associated with a partial area or device of the HMB 1120 corresponding to the corruption notification.

Figure 7:
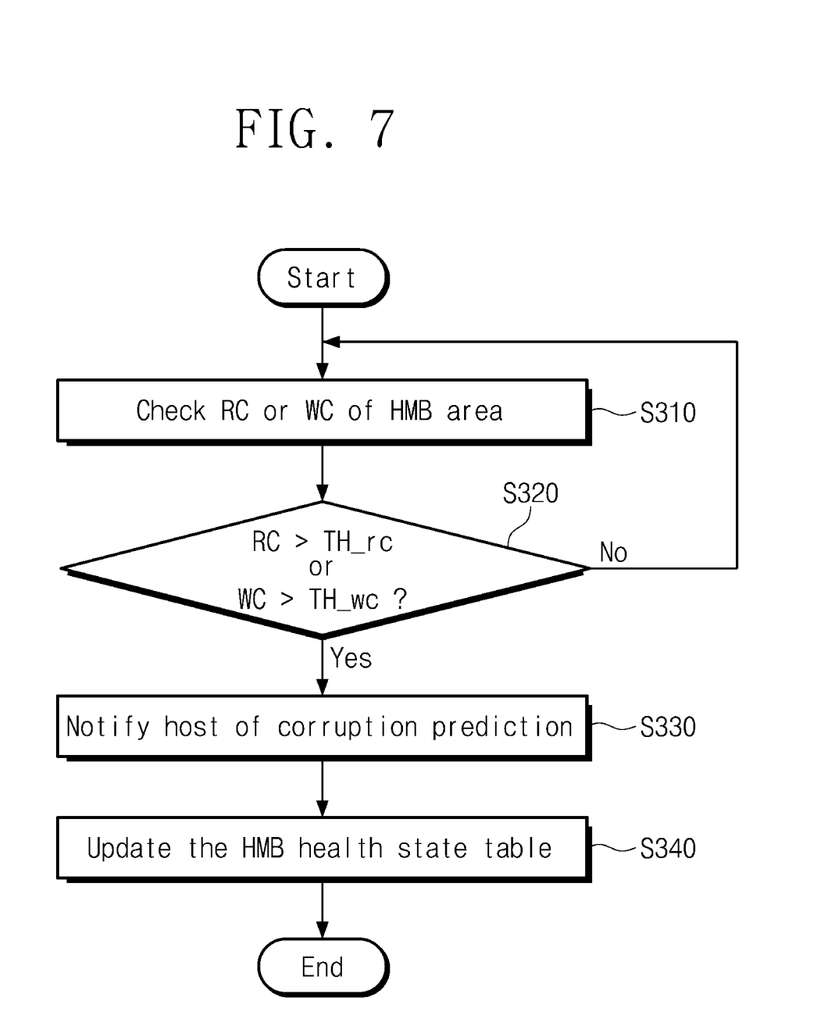
FIG. 7 is a flowchart illustrating an operation of a corruption prediction module of an HMB controller according to an exemplary embodiment of the present inventive concept.

FIG. 7 is a flowchart illustrating an operation of a corruption prediction module 1244 of an HMB controller 1243 according to an exemplary embodiment of the present inventive concept. Referring to FIG. 7, the HMB controller 1243 may monitor a health state for each area of the HMB 1120 and may generate a corruption prediction notification depending on a monitoring result.

In operation S310, the HMB controller 1243 may monitor health state information of each of the HMB areas according to data attributes with reference to access requests of the HMB 1120. Here, for convenience of description, the monitoring of the write count WC or the read count RC associated with each of the HMB areas of the HMB 1120 will be exemplified. However, the HMB controller 1243 may use the error rate ER for corruption prediction. For example, the HMB controller 1243 may monitor an allowable degree of correctable error and may determine transmission of the corruption prediction notification when the degree of danger is high.

In operation S320, the HMB controller 1243 may check whether at least one HMB area has a write count WC that exceeds a write threshold value TH_wc. Alternatively, the HMB controller 1243 may check whether at least one HMB area has a read count RC that exceeds a read threshold value TH_rc. When the read count RC or the write count WC does not exceed the threshold value TH_rc or the write threshold value TH_wc (No), the flow proceeds to operation S310 to continue to monitor the health state. When an HMB area in which the read count RC or the write count WC is greater than the read threshold value TH_rc or the write threshold value TH_wc (Yes), the flow proceeds to operation S330.

In operation S330, the HMB controller 1243 transmits a corruption prediction notification associated with the specific HMB area to the host 1100. The corruption prediction notification may be a signal indicating simple corruption prediction, and may include information about a location of a corruption-predicted HMB area or information requesting reallocation.

In operation S340, the HMB controller 1243 updates the read count RC or the write count WC of a relevant HMB area stored in the HMB health state table 1246. In the case where a new HMB area is allocated, the HMB controller 1243 may create and maintain an item associated with the newly allocated area in the HMB health state table 1246.

Before critical corruption occurs, the HMB controller 1243 may, in advance, transmit the corruption prediction notification to the host 1100 according to health state monitoring for each area of the HMB 1120. Accordingly, reliability of an operation of the storage device 1200 may be increased by preventing a critical corruption issue due to a progressive defect or deterioration of the HMB 1120.

Figure 8:
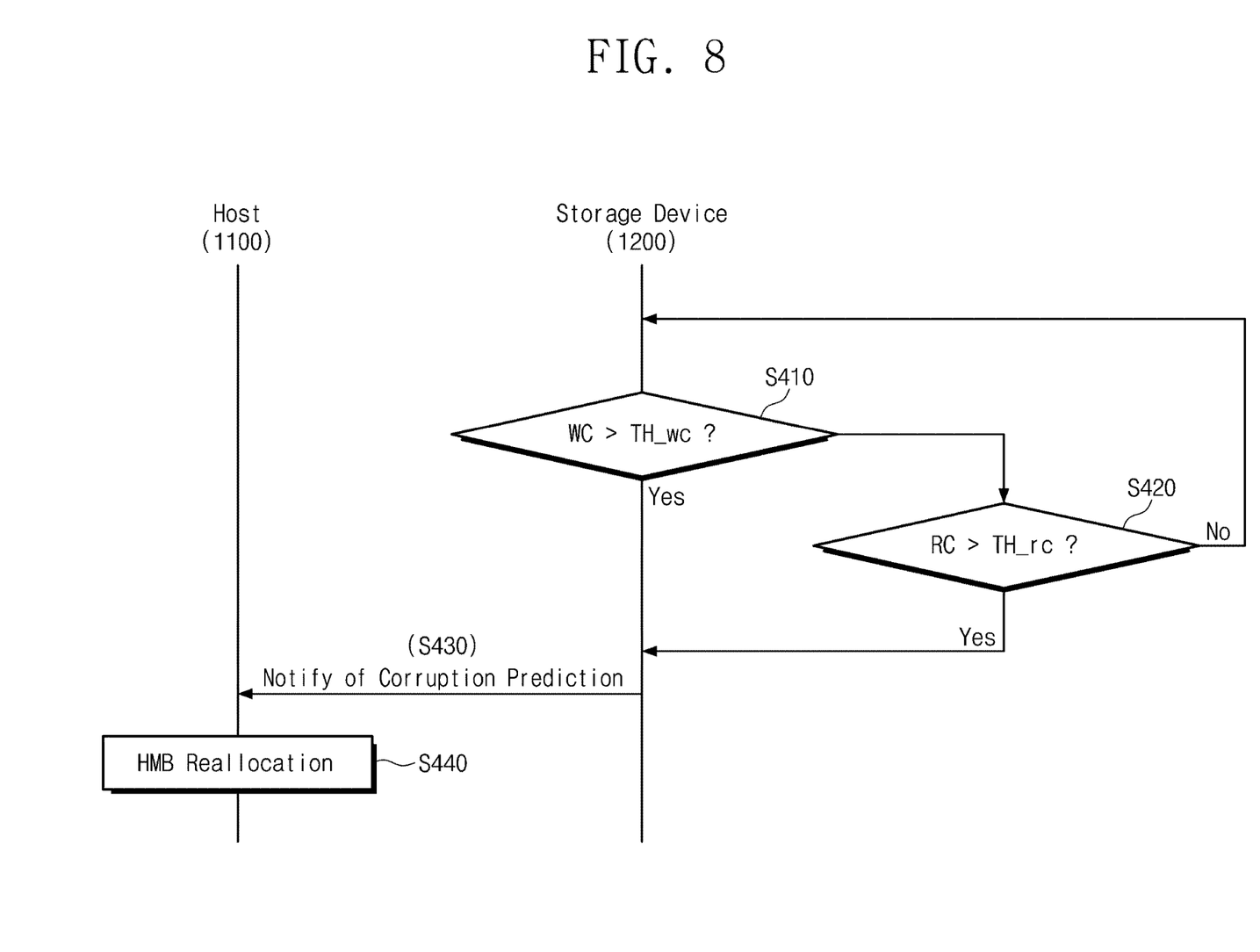
FIG. 8 is a diagram illustrating a mutual operation of a host and a corruption prediction module according to an exemplary embodiment of the present inventive concept.

FIG. 8 is a diagram illustrating an exemplary mutual operation of a host 1100 and a corruption prediction module 1244 of an HMB controller 1243 according to an exemplary embodiment of the present inventive concept. Referring to FIG. 8, the storage device 1200 monitors a health state of each HMB area of the HMB 1120 and transmits a corruption prediction notification to the host 1100 when results suggest potential future corruption.

In operation S410, the storage device 1200 checks the write count WC of each HMB area of the HMB 1120. When an HMB area in which the write count WC is greater than the write threshold value TH_wc exists, the storage controller 1240 may transmit a corruption prediction notification to the host 1100. However, when an HMB area does not have a write count WC that is greater than the write threshold value TH_wc, the storage controller 1240 proceeds to operation S420 for detecting the read count RC.

In operation S420, the storage device 1200 checks the read count RC of each HMB area of the HMB 1120. When an HMB area in which the read count RC is greater than the read threshold value TH_rc is present in the HMB areas (Yes), the storage controller 1240 may proceed to operation S430 and may transmit a corruption prediction notification to the host 1100. However, when an HMB area in which the read count RC is greater than the read threshold value TH_rc is not detected (No), the storage controller 1240 may continue to monitor an HMB health state according to operations S410 and S420.

In operation S440, the host 1100 may reallocate the error-predicted HMB area to any other normal memory area in response to the corruption prediction notification. Alternatively, the host 1100 may adjust an operating parameter associated with a partial area or a partial device of the HMB 1120, in which corruption is predicted. For example, the host 1100 may attempt to initialize a partial area or a partial device of the HMB 1120, in which corruption is predicted, or to adjust an operating parameter and a training parameter.

Figure 9:
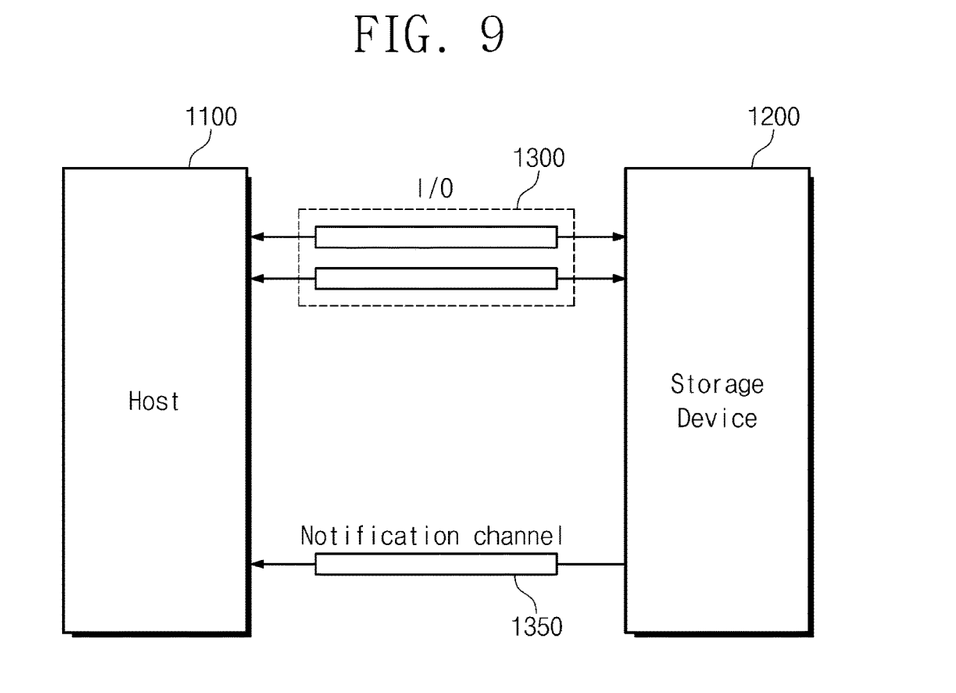
FIG. 9 is a block diagram illustrating a storage device having a separate channel for transmitting a corruption notification or a corruption prediction notification to a host, according to an exemplary embodiment of the present inventive concept.

FIG. 9 is a block diagram illustrating a storage device having a separate channel for transmitting a corruption notification or a corruption prediction notification to a host, according to an exemplary embodiment of the present inventive concept. Referring to FIG. 9, the storage device 1200 may include a notify channel 1350 for transmitting a corruption notification or a corruption prediction notification for a HMB area to the host 1100.

The host 1100 and the storage device 1200 may include an input/output (I/O) channel 1300 for transmitting data. The host 1100 and the storage device 1200 may communicate with each other based on various interface schemes. In particular, the host 1100 and the storage device 1200 may include the notify channel 1350 which notifies the host 1100 of corruption occurring in the HMB or requests reallocation of the HMB. The host 1100 and the storage device 1200 may include a separate pin or pad for the notify channel 1350. Alternatively, the host 1100 and the storage device 1200 may use a pin not used among existing pins as a pin for the notify channel 1350.

Figure 10:
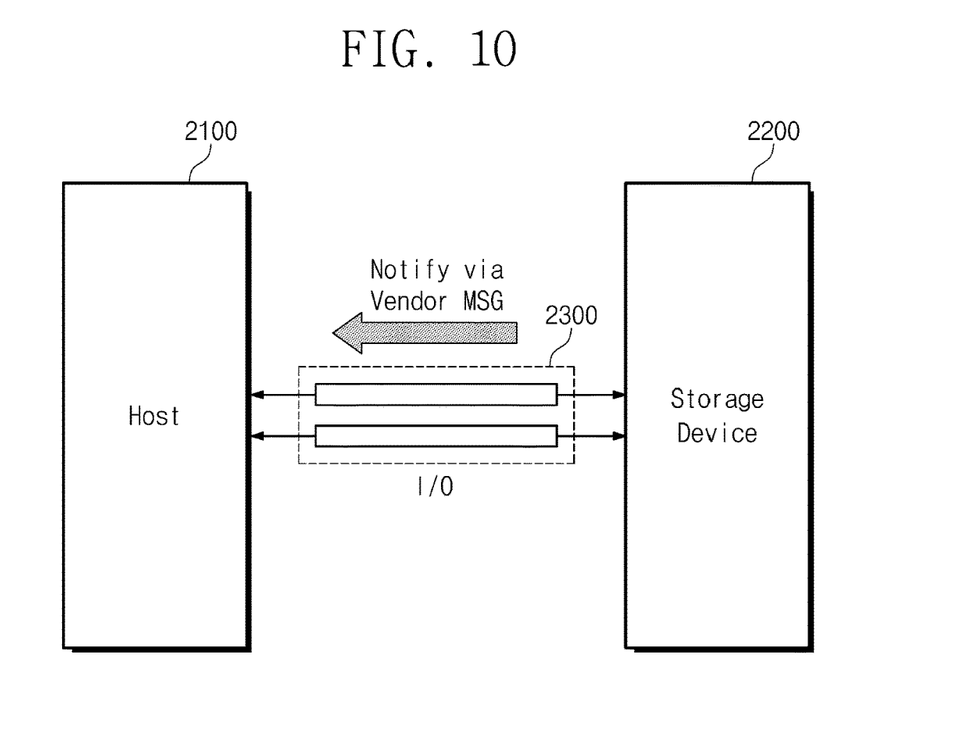
FIG. 10 is a block diagram illustrating a storage device having a channel for transmitting a corruption notification or a corruption prediction according to another exemplary embodiment of the present inventive concept.

FIG. 10 is a block diagram illustrating a storage device having a notify channel according to another exemplary embodiment of the present inventive concept. Referring to FIG. 10, a storage device 2200 may implement a corruption notification or a corruption prediction notification for a HMB area to a host 2100 through a vendor message (MSG) channel.

The host 2100 and the storage device 2200 may include an I/O channel 2300 for transmitting data. The storage device 2200 may transmit a corruption notification or a corruption prediction notification of the HMB or a message requesting reallocation of the HMB by using an existing V channel.

According to an exemplary embodiment of the present inventive concept, a storage device which shares a host memory with a host may monitor a HMB area. The storage device may detect or predict corruption or deterioration with reference to a monitoring result of the HMB area, thus preventing a critical defect from occurring.

While exemplary embodiments of the present inventive concept have been shown and described above, it will be understood by one of ordinary skill in the art that variations in form and detail may be made therein without departing from the spirit and scope of the present disclosure as defined by the appended claims.

What is claimed is:

1. A memory management method of a storage device to which a host memory of a host is allocated as a buffer, the method comprising:
    dividing, at the storage device, the buffer into a plurality of buffer areas and detecting deterioration information of each of the plurality of buffer areas;
    using the storage device to determine, whether a first buffer area exceeds an error threshold based upon the detected deterioration information; and transmitting a corruption prediction notification associated with the first buffer area to the host when the first buffer area exceeds the error threshold, wherein the deterioration information includes a read count, a write count, or an error rate of each of the plurality of buffer areas.

2. The method of claim 1, further comprising:

transmitting a corruption notification associated with a second buffer area to the host when an error indicates a correction-impossible state exists in the second buffer area.

3. The method of claim 2, wherein the corruption prediction notification or the corruption notification includes a message requesting reallocation of the first buffer area or the second buffer area to a normal memory area of the host memory.

4. The method of claim 3, wherein the host adjusts an operating parameter of the host memory or a training parameter of the host memory in response to the corruption prediction notification or the corruption notification.

5. The method of claim 3, wherein the host initializes the host memory in response to the corruption prediction notification or the corruption notification.

6. The method of claim 1, wherein the plurality of buffer areas are divided according to attributes of data to be stored in each of the plurality of buffer areas.

7. The storage device of claim 1, wherein the corruption prediction notification or corruption notification is transmitted to the host through a message transmission channel.

8. The storage device of claim 1, wherein the corruption prediction notification is transmitted to the host through a pin for the host.

9. A storage device which uses a host memory of a host as a buffer, comprising:

an interface configured to communicate with the host;

a non-volatile memory device; and a storage controller configured to divide a buffer area allocated from the host memory through the interface into a plurality of buffer areas, monitor a deterioration state for each of the plurality of buffer areas, and transmit a corruption notification or a corruption prediction notification when a deterioration state exceeds a threshold, wherein the deterioration state includes a read count, a write count, or an error rate of each of the plurality of buffer areas, wherein the deterioration state is updated in a host memory buffer health table managed by the storage controller.

10. The storage device of claim 9, wherein the storage controller includes a host memory buffer controller detecting the deterioration state for each of the plurality of buffer areas.

11. The storage device of claim 10, wherein the host memory buffer controller includes:

a corruption detection module configured to determine corruption of data based on the error rate;

a corruption prediction module configured to monitor the read count or the write count and to predict occurrence of corruption of the plurality of buffer areas; and a health state table configured to store and update the error rate, the read count, and the write count of the plurality of buffer areas the first area.

12. The storage device of claim 11, wherein, when at least one of the read count and the write count exceeds a relevant threshold value with reference to the health state table, the host memory buffer controller transmits the corruption prediction notification to the host.

13. The storage device of claim 11, wherein, when the error rate exceeds a reference value with reference to the health state table, the host memory buffer controller transmits the corruption notification to the host.

14. The storage device of claim 11, wherein the host memory buffer controller requests reallocation of a first area of the host memory to a second area of the host memory with reference to the health state table.

15. The storage device of claim 9, wherein the storage controller transmits the corruption prediction notification to the host through a message transmission channel of the interface.

16. The storage device of claim 9, wherein the storage controller transmits the corruption prediction notification to the host through a separate pin appointed with the host.

17. The storage device of claim 9, wherein the interface includes at least one of a peripheral component interconnect express (PCIe), a non-volatile memory express (NVMe), and a universal flash storage (UFS).

18. The storage device of claim 9, wherein the plurality of buffer areas are divided according to attributes of data to be stored in each of the plurality of buffer areas.

\* \* \* \* \*